United States Patent
Hassan et al.

(10) Patent No.: US 12,002,769 B2
(45) Date of Patent: Jun. 4, 2024

(54) SWITCH WITH ELECTROSTATIC DISCHARGE (ESD) PROTECTION

(71) Applicant: QUALCOMM Incorporated, San Diego, CA (US)

(72) Inventors: Muhammad Hassan, San Diego, CA (US); Bhushan Shanti Asuri, San Diego, CA (US); Jeremy Darren Dunworth, La Jolla, CA (US); Ravi Sridhara, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 18/300,256

(22) Filed: Apr. 13, 2023

(65) Prior Publication Data
US 2023/0253346 A1    Aug. 10, 2023

Related U.S. Application Data

(63) Continuation of application No. 17/118,253, filed on Dec. 10, 2020, now Pat. No. 11,646,277.

(51) Int. Cl.
*H03F 3/45* (2006.01)
*H01L 23/60* (2006.01)
(Continued)

(52) U.S. Cl.
CPC ............ *H01L 23/60* (2013.01); *H03F 3/195* (2013.01); *H03F 3/245* (2013.01);
(Continued)

(58) Field of Classification Search
CPC .................................... H03F 3/45; H03F 9/00
(Continued)

(56) References Cited

U.S. PATENT DOCUMENTS

| 7,769,355 B2 * | 8/2010 | Ichitsubo ............ H03F 3/24 455/90.3 |
| 8,427,796 B2 | 4/2013 | Worley et al. |

(Continued)

FOREIGN PATENT DOCUMENTS

| EP | 3518284 A1 | 7/2019 |
| WO | 2019168221 A1 | 9/2019 |

OTHER PUBLICATIONS

Dunworth J.D., et al., "A 28GHz Bulk-CMOS Dual-Polarization Phased-Array Transceiver with 24 Channels for 5G User and Basestation Equipment", IEEE International Solid-State Circuits Conference, Feb. 12, 2018, pp. 70-72.

(Continued)

*Primary Examiner* — Henry Choe
(74) *Attorney, Agent, or Firm* — Loza & Loza

(57) ABSTRACT

In certain aspects, a chip includes a pad, and a power amplifier having a first output and a second output. The chip also includes a transformer, wherein the transformer includes a first inductor coupled between a first terminal and a second terminal of the transformer, wherein the first terminal is coupled to the first output of the power amplifier, and the second terminal is coupled to the second output of the power amplifier. The transformer also includes a second inductor coupled between a third terminal and a fourth terminal of the transformer, wherein the third terminal is coupled to the pad. The chip also includes a first switch coupled to the fourth terminal, a shunt inductor coupled in parallel with the first switch, and a low-noise amplifier coupled to the third terminal.

23 Claims, 11 Drawing Sheets

(51) Int. Cl.
*H03F 3/195* (2006.01)
*H03F 3/24* (2006.01)

(52) U.S. Cl.
CPC .. *H03F 2200/318* (2013.01); *H03F 2200/441* (2013.01); *H03F 2200/451* (2013.01); *H03F 2200/541* (2013.01)

(58) Field of Classification Search
USPC ........................................ 330/252, 276, 165
See application file for complete search history.

(56) References Cited

U.S. PATENT DOCUMENTS

| | | | |
|---|---|---|---|
| 8,913,976 B2 | 12/2014 | Khatri et al. | |
| 9,042,844 B2 * | 5/2015 | Yu ........................... | H04B 1/44 330/276 |
| 9,246,447 B2 | 1/2016 | Vice | |
| 9,265,109 B2 | 2/2016 | Muramatsu et al. | |
| 10,242,979 B1 | 3/2019 | Edwards | |
| 2012/0295559 A1 * | 11/2012 | Kwok ....................... | H04B 1/48 455/83 |
| 2014/0113573 A1 * | 4/2014 | Khatri ....................... | H03F 3/72 455/78 |
| 2015/0333791 A1 | 11/2015 | Anderson et al. | |
| 2018/0026592 A1 * | 1/2018 | Wallis ..................... | H03F 1/523 330/302 |
| 2019/0165465 A1 | 5/2019 | Visser | |
| 2022/0189886 A1 | 6/2022 | Hassan | |

OTHER PUBLICATIONS

International Search Report and Written Opinion—PCT/US2021/061600—ISA/EPO—dated Mar. 17, 2022.

* cited by examiner

SWITCH WITH ELECTROSTATIC DISCHARGE (ESD) PROTECTION

RELATED APPLICATION

The present application is a continuation of U.S. application Ser. No. 17/118,253, filed on Dec. 10, 2020, the entire specification of which is incorporated herein by reference.

BACKGROUND

Field

Aspects of the present disclosure relate generally to electrostatic discharge (ESD) protection, and more particularly, to a switch with ESD protection.

Background

In a wireless device, a transmitter and a receiver may share an antenna using time division duplexing (TDD) in which the transmitter transmits signals via the antenna in a transmit mode and the receiver receives signals via the antenna in a receive mode. The wireless device may also include a switch for switching between the transmit mode and the receive mode. The switch may be susceptible to damage from an electrostatic discharge (ESD) event. For example, an ESD event may damage or rupture the gate oxide of the switch. Damage caused by ESD events may reduce manufacturing yields and/or lead to operational failures.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a chip. The chip includes a pad, and a power amplifier having a first output and a second output. The chip also includes a transformer, wherein the transformer includes a first inductor coupled between a first terminal and a second terminal of the transformer, wherein the first terminal is coupled to the first output of the power amplifier, and the second terminal is coupled to the second output of the power amplifier. The transformer also includes a second inductor coupled between a third terminal and a fourth terminal of the transformer, wherein the third terminal is coupled to the pad. The chip also includes a first switch coupled to the fourth terminal, a shunt inductor coupled in parallel with the first switch, and a low-noise amplifier coupled to the third terminal.

A second aspect relates to an apparatus. The apparatus includes a chip including a pad, a power amplifier, a transformer coupled between an output of the power amplifier and the pad, a first switch coupled between the transformer and a ground, and a low-noise amplifier coupled to the pad.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
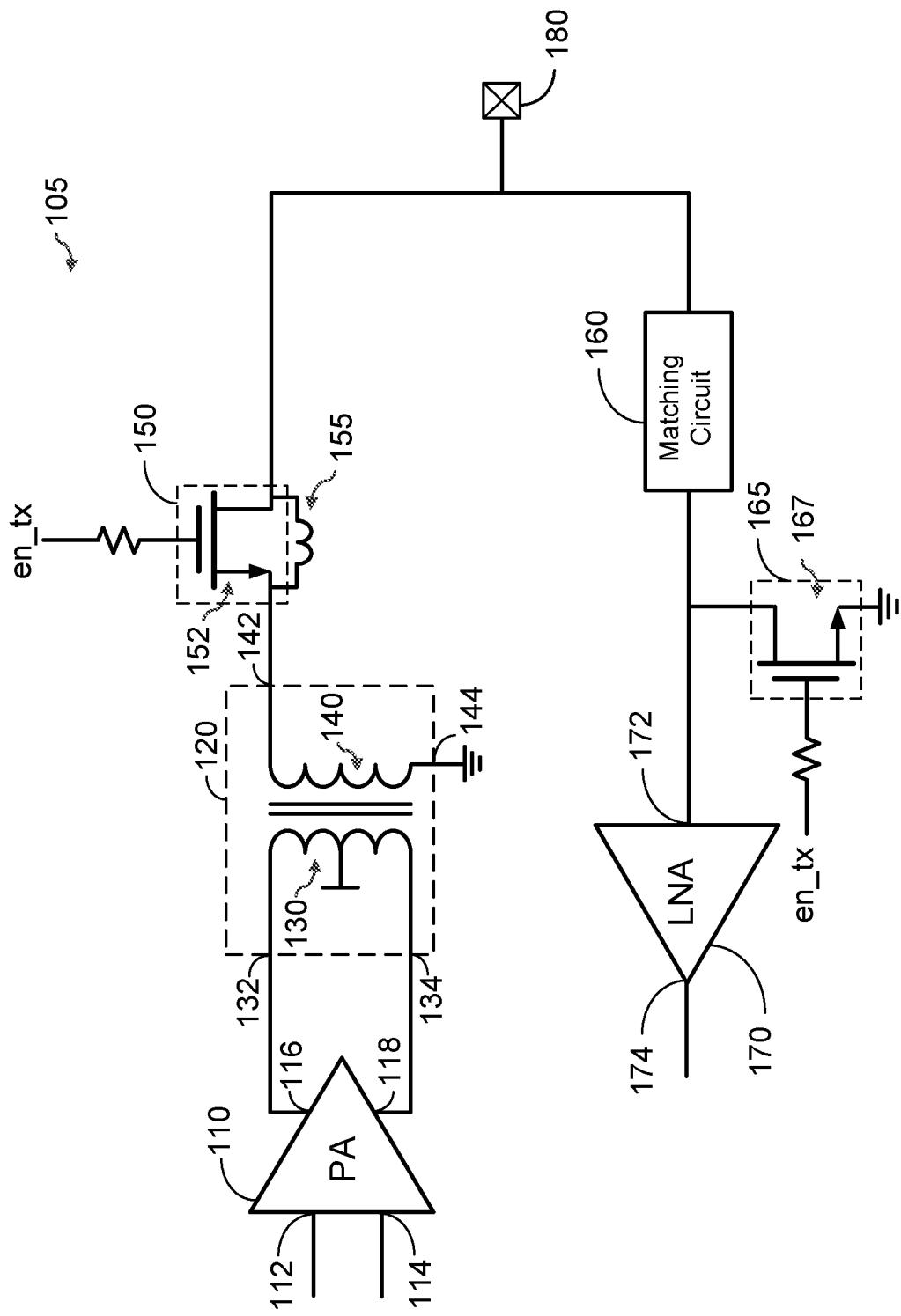
FIG. 1 shows an example of a transceiver including a switch according to certain aspects of the present disclosure.

FIG. 1 shows an example of a transceiver 105 including a power amplifier (PA) 110, a low-noise amplifier (LNA) 170, a transformer 120, and a switch 150 according to certain aspects. The PA 110 is part of a transmitter of the transceiver 105 and the LNA 170 is part of a receiver of the transceiver 105. The transceiver 105 may be integrated on a chip including a pad 180 for coupling the transceiver 105 to an off-chip antenna (not shown in FIG. 1). The pad 180 may also be referred to as an input/output (I/O) pad, a pin, or another term.

In this example, the switch 150 is coupled between the transformer 120 and the pad 180. As discussed further below, the transmitter and the receiver of the transceiver 105 may share the antenna coupled to the pad 180 using time division duplexing (TDD) in which the PA 110 outputs an RF signal for transmission via the antenna in a transmit mode and the LNA 170 receives an RF signal via the antenna in a receive mode. In this regard, a controller (not shown in FIG. 1) turns on the switch 150 in the transmit mode and turns off the switch 150 in the receive mode. In this example, the switch 150 may also be referred to as a transmit-receive (TRX) switch. In the example in FIG. 1, the switch 150 is implemented with a transistor 152.

In this example, the PA 110 is a differential PA configured to output a differential RF signal at a differential output including a first output 116 and a second output 118. It is to be appreciated that, in some implementations, the differential PA may be implemented with two amplifiers where one of the amplifiers drives the first output 116 and the other one of the amplifiers drives the second output 118.

The transformer 120 includes a first inductor 130 (e.g., primary inductor) and a second inductor 140 (e.g., secondary inductor), in which the second inductor 140 is magnetically coupled with the first inductor 130. Each of the inductors 130 and 140 may be implemented with a coil inductor, spiral inductor, slab inductor, or another type of inductor. The inductors 130 and 140 may also be referred to as windings of the transformer 120 or sides of the transformer 120 (e.g., primary side and secondary side).

In this example, the first inductor 130 of the transformer 120 is coupled between a first terminal 132 of the transformer 120 and a second terminal 134 of the transformer 120. The first terminal 132 is coupled to the first output 116 of the PA 110 and the second terminal 134 is coupled to the second output 118 of the PA 110. As shown in FIG. 1, a center tap of the first inductor 130 may be DC biased. The second inductor 140 of the transformer 120 is coupled between a third terminal 142 of the transformer 120 and a fourth terminal 144 of the transformer 120. The switch 150 is coupled between the third terminal 142 and the pad 180, and the fourth terminal 144 is coupled to ground.

In the transmit mode, the PA 110 receives an input signal (e.g., from a mixer, a phase shifter, or another device). The input signal may be a differential input signal received at a differential input including a first input 112 and a second input 114. The PA 110 amplifies the input signal to obtain a differential output signal and outputs the differential output signal at the differential output of the PA 110. The transformer 120 is configured to convert the differential output signal of the PA 110 into a single-ended RF signal at the third terminal 142. The single-ended RF signal is output to the pad 180 via the switch 150 (which is turned on in the transmit mode). The transformer 120 may also be configured to provide impedance matching between the antenna (not shown in FIG. 1) coupled to the pad 180 and the differential output of the power amplifier 110.

In the receive mode, the LNA 170 receives an RF signal at the input 172 from the antenna via the pad 180. The LNA 170 may amplify the received RF signal, and output the amplified signal to a mixer, a phase shifter, or another device in the receiver. In the receive mode, the switch 150 is turned off. This may be done, for example, to help isolate the LNA 170 from the transformer 120 to prevent the transformer 120 from loading the input 172 of the LNA 170 in the receive mode, which degrades the noise figure of the LNA 170.

In the example in FIG. 1, the transceiver 105 includes an impedance matching circuit 160 and a pull-down switch 165. The impedance matching circuit 160 is coupled between the pad 180 and the input 172 of the LNA 170. The impedance matching circuit 160 is configured to provide impedance matching between the antenna (not shown in FIG. 1) and the input 172 of the LNA 170. The impedance matching circuit 160 may be implemented with one or more inductors, one or more resistors, or any combination thereof.

The pull-down switch 165 is coupled between the input 172 of the LNA 170 and ground. The pull-down switch 165 may be implemented with a transistor 167 (e.g., NFET), as shown in the example in FIG. 1. In the receive mode, the controller (not shown in FIG. 1) turns off the pull-down switch 165. In the transmit mode, the controller turns on the pull-down switch 165, which pulls the input 172 of the LNA 170 to ground. This may be done, for example, to protect the input 172 of the LNA 170 from potential damage due to a large RF signal from the PA 110 in the transmit mode.

In certain aspects, it is desirable to provide the transceiver 105 with electrostatic discharge (ESD) protection. An ESD event may occur when charge is unintentionally transferred to the pad 180. The charge may cause a large potential to appear on the pad 180, which can damage the LNA 170 and/or another device (not shown) coupled to the pad 180. An ESD event may also occur when charge builds up on the chip and is discharged to an object contacting the pad 180. To protect against an ESD event, it is desirable to provide a discharge path between the pad 180 and ground to safely discharge the charge during an ESD event.

To provide a discharge path between the pad 180 and ground during an ESD event, the transceiver 105 may include a shunt inductor 155 coupled in parallel with the switch 150, as shown in the example in FIG. 1. The inductance of the shunt inductor 155 may be chosen such that the shunt inductor 155 approximates a short during an ESD event. The shunt inductor 155 is coupled in series with the second inductor 140 of the transformer 120. During an ESD event, the shunt inductor 155 and the second inductor 140 of the transformer 120 provide a discharge path (i.e., shunt path) between the pad 180 and ground to pass ESD current.

In the example in FIG. 1, the transistor 152 implementing the switch 150 is coupled between the transformer 120 and the pad 180. As a result, the source and drain of the transistor 152 may experience large voltage swings in the transmit mode from the output RF signal of the PA 110. The large voltage swings may place high voltage stress on the transistor 152 and/or increase intermodulation distortion due to the body-effect.

Figure 2:
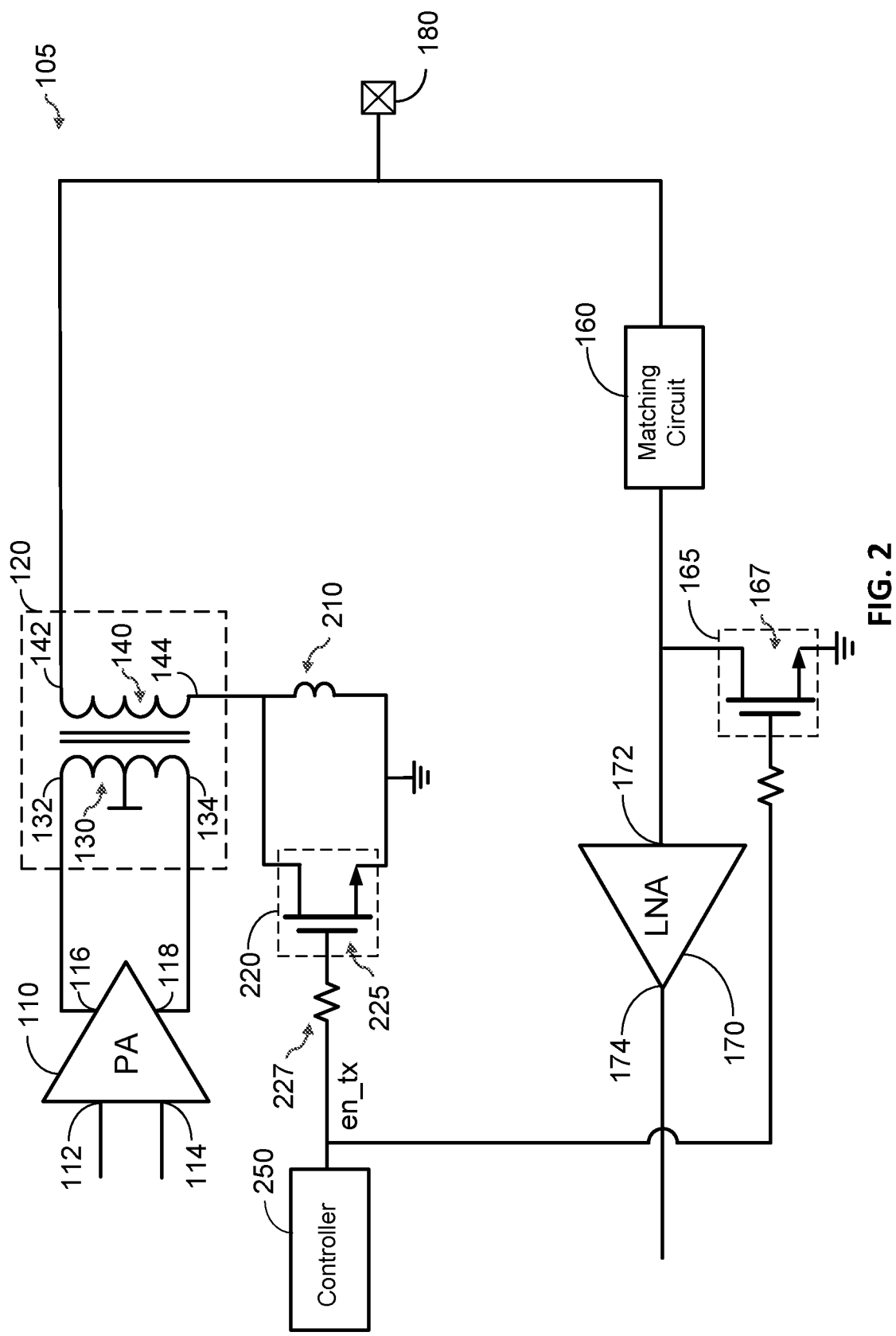
FIG. 2 shows another example of a transceiver including a switch according to certain aspects of the present disclosure.

FIG. 2 shows an example in which the transceiver 105 includes a switch 220 coupled between the fourth terminal 144 of the transformer 120 and ground instead of the switch 150 shown in FIG. 1. In this example, the switch 220 is implemented with a transistor 225 (e.g., NFET). FIG. 2 also shows an example of a controller 250 coupled to the switch 220 (e.g., the gate of the transistor 225) and the pull-down switch 165 (e.g., the gate of the transistor 167).

In the transmit mode, the controller 250 turns on the transistor 225, which couples the fourth terminal 144 of the transformer 120 to ground. For the example where the transistor 225 is an NFET, the controller 250 may turn on the transistor 225 by applying a voltage (e.g., 0.6 V or higher) on the gate of the transistor 225 greater than the threshold voltage of the transistor 225. The controller 250 may also turn on the pull-down switch 165 (e.g., turn on the transistor 167) to pull the input 172 of the LNA 170 to ground in the transmit mode.

In the receive mode, the controller 250 turns off the transistor 225. For the example where the transistor 225 is an NFET, the controller 250 may turn off the transistor 225 by pulling the gate of the transistor 225 to ground. Placing the switch 220 between the transformer 120 and ground substantially reduces the voltage swing at the drain of the transistor 225 in the transmit mode compared with the switch 150 in FIG. 1, which is coupled between the third terminal 142 of the transformer 120 and the pad 180. The smaller voltage swing reduces voltage stress on the transistor 225 and/or intermodulation distortion due to the body-effect. The controller 250 may also turn off the pull-down switch 165 (e.g., turn off the transistor 167) in the receive mode.

In the example in FIG. 2, the transceiver 105 includes a resistor 227 coupled between the gate of the transistor 225 and the controller 250. Because the controller 250 outputs a DC voltage to turn on the transistor 225 in the transmit mode, the resistor 227 is coupled between the gate of the transistor 225 and AC ground. This allows the voltage at the gate of the transistor 225 to swing with the voltage at the drain of the transistor 225, which effectively reduces parasitic capacitance seen from the drain side.

In the example in FIG. 2, the transceiver 105 also includes a shunt inductor 210 coupled in parallel with the transistor 225. In this example, the shunt inductor 210 is coupled between the fourth terminal 144 of the transformer 120 and ground. The shunt inductor 210 is also coupled in series with the second inductor 140. The inductance of the shunt inductor 210 may be chosen such that the shunt inductor 210 approximates a short during an ESD event. During an ESD event, the shunt inductor 210 and the second inductor 140 of the transformer 120 provide a discharge path (i.e., shunt path) between the pad 180 and ground to pass ESD current.

When the transistor 225 is turned off in the receive mode, the shunt inductor 210 is coupled in parallel with the off capacitance (e.g., drain-to-ground capacitance and/or drain-to-source capacitance) of the transistor 225 which forms an LC network. In one example, the inductance of the shunt inductor 210 may be chosen such that the LC network resonates at a frequency (e.g., center frequency) of the RF signal received by the LNA 170 in the receive mode. This causes the LC network to provide a high impedance to the RF signal in the receive mode. The high impedance reduces loading on the input 172 of the LNA 170 in the receive mode, which improves the noise figure of the LNA 170. For the example of millimeter wave (mmWave) communications, the resonant frequency may be in the range of 24 GHz to 100 GHz.

In certain aspects, there is little to no loading from parasitic capacitances of the transistor 225 (e.g., drain-to-body capacitance and source-to-body capacitance) in both the transmit mode and the receive mode. This is because the transistor 225 is turned on the in transmit mode, and the parasitic capacitances are resonated out by the shunt inductor 210 in the receive mode.

The chip including the transceiver 105 may undergo one or more ESD qualification tests based on a charged device model (CDM) to evaluate the ESD robustness of the chip. During a CDM test, the chip is positively or negatively charged. The chip is then discharged through a grounded pin that makes contact with the pad 180 of the chip. In this example, the chip fails the CDM test if one or more devices on the chip suffer an ESD failure.

The transistor 225 is vulnerable to failure during a CDM test. For example, when the chip is charged during the charging phase of the CDM test, there is a time lag between charging of the gate of the transistor 225 and charging of the drain of the transistor 225. The time lag may cause a large voltage to develop between the gate and the drain of the transistor 225, which can rupture the gate oxide of the transistor 225. In addition, during the discharging phase of the CDM test, a sudden voltage induced by the discharge current can also cause a large voltage to develop between the gate and the drain of the transistor 225, which can rupture the gate oxide of the transistor 225. As semiconductor processes scale down, the gate oxide becomes more vulnerable to rupturing. Accordingly, there is a need to prevent the voltage between the drain and the gate of the transistor 225 from reaching the breakdown (e.g., gate-oxide breakdown) voltage of the transistor 225 during a CDM test, and therefore make the transistor 225 more robust in a CDM test. Since a CDM test is intended to simulate an ESD event that may occur outside of the test, there is also a need to prevent the voltage between the drain and the gate of the transistor 225 from reaching the breakdown voltage of the transistor 225 during the ESD event outside of the test.

Figure 3A:
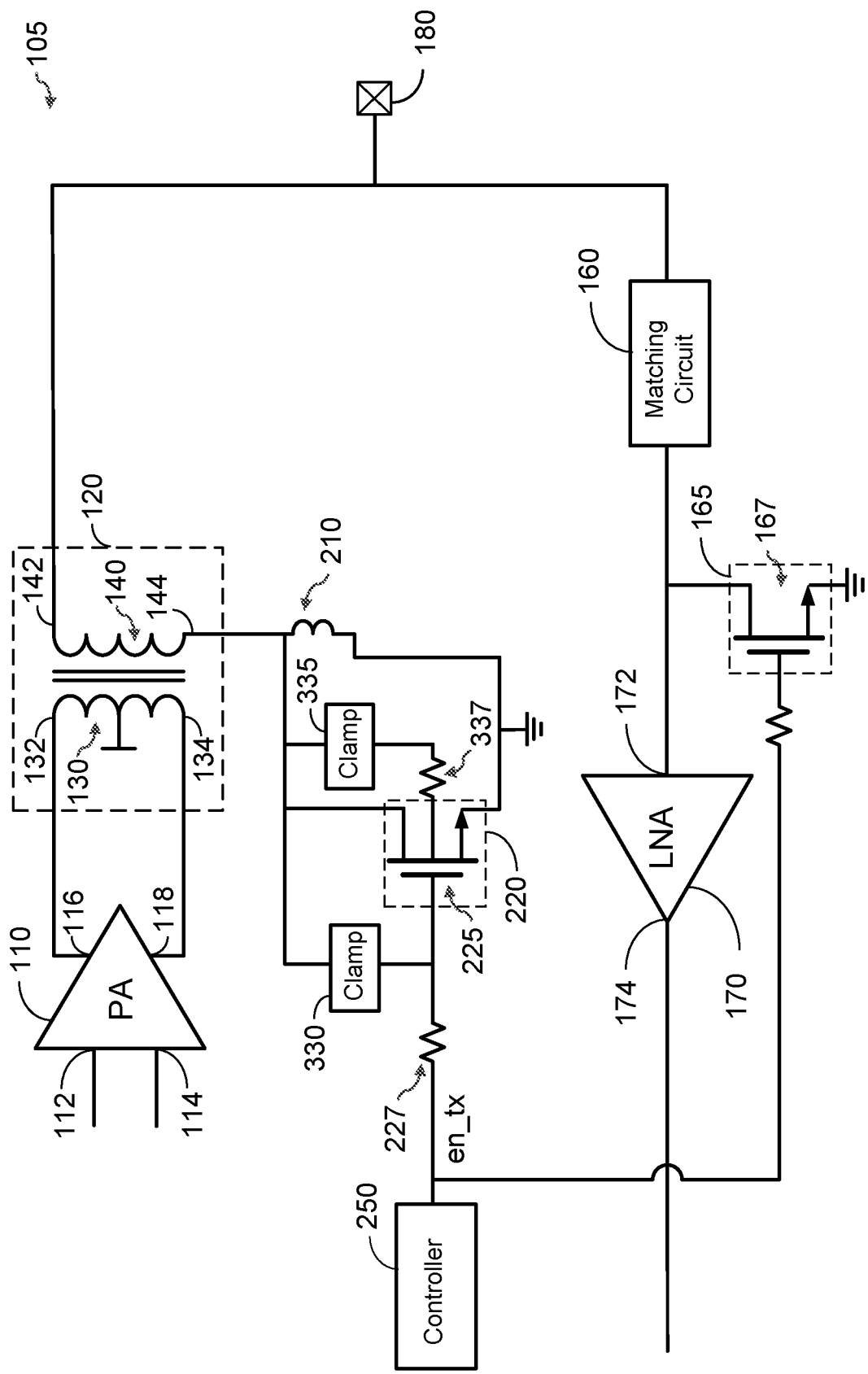
FIG. 3A shows an example of a transceiver including a switch and one or more clamp circuits configured to provide ESD protection for the switch according to certain aspects of the present disclosure.

FIG. 3A shows an example in which the transceiver 105 includes a first clamp circuit 330 coupled between the gate and the drain of the transistor 225 according to certain aspects. The first clamp circuit 330 is configured to limit the voltage between the gate and the drain of the transistor 225 to a voltage below the breakdown voltage of the transistor 225. This prevents the voltage between the gate and the drain of the transistor 225 from reaching the breakdown voltage of the transistor 225 during a CDM test or another ESD event (e.g., ESD event outside the CDM test) and damaging the transistor 225 (e.g., rupturing the gate oxide of the transistor 225).

In the example in FIG. 3A, the transceiver 105 also includes a second clamp circuit 335 coupled between the body and the drain of the transistor 225 according to certain aspects. The second clamp circuit 335 is configured to limit the voltage between the body and the drain of the transistor 225 to a voltage below the breakdown voltage of the transistor 225. This prevents the voltage between the body and the drain of the transistor 225 from reaching the breakdown voltage of the transistor 225 during a CDM test or another ESD event and damaging the transistor 225. Each of the clamp circuits 330 and 335 may be implemented with one or more diodes, a clamp transistor and a trigger device, or another type of clamp circuit.

In the example in FIG. 3A, the transceiver 105 includes a resistor 337 coupled between the body of the transistor 225 and the second clamp circuit 335. In the transmit mode, the resistor 337 allows the voltage at the body of the transistor 225 to swing with the voltage at the drain of the transistor 225, which effectively reduces parasitic capacitance seen from the drain side.

Figure 3B:
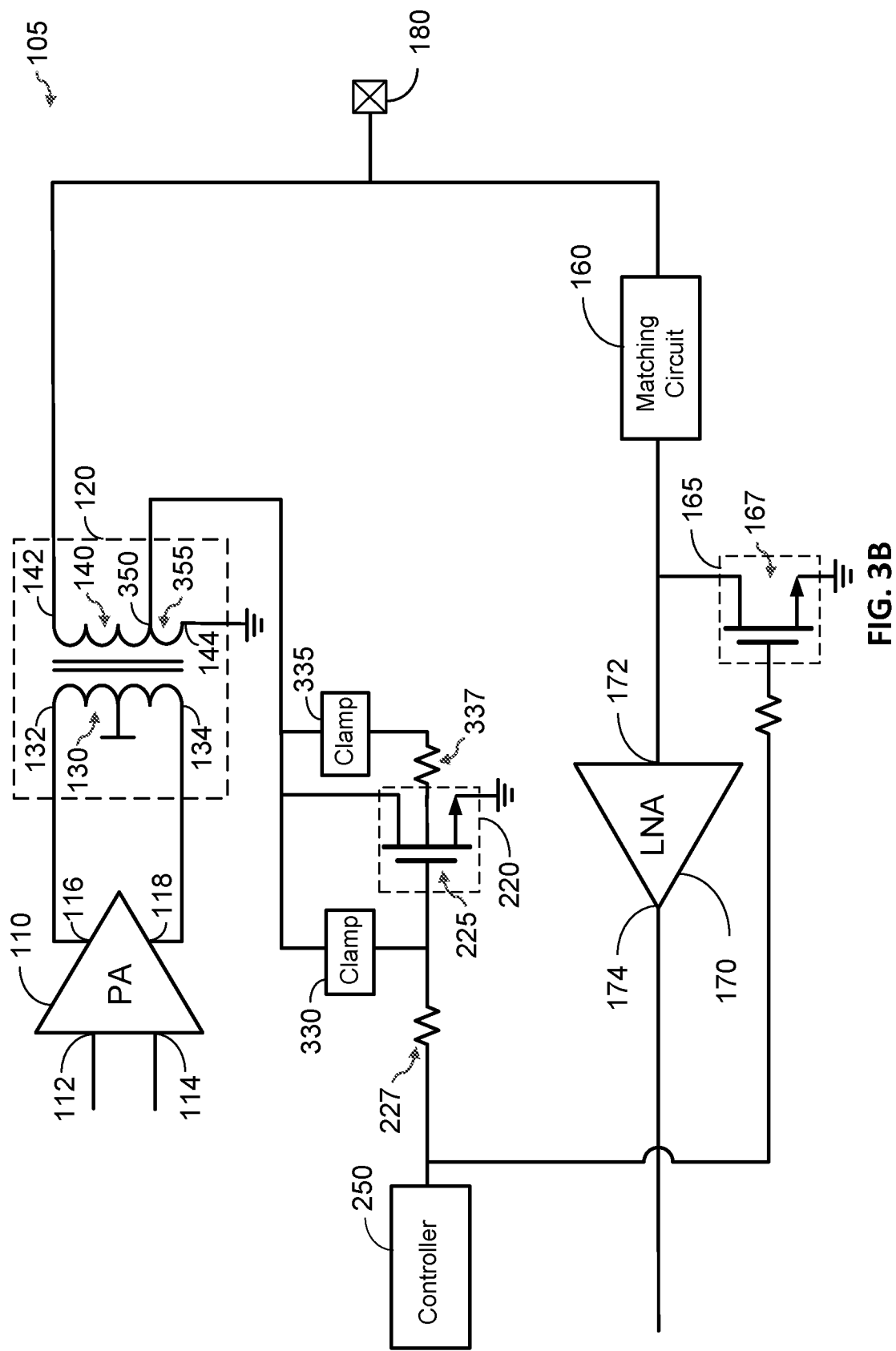
FIG. 3B shows an example of the transceiver in which a portion of a transformer is used to shunt ESD current around the switch according to certain aspects of the present disclosure.

In the example in FIG. 3A, the shunt inductor 210 is used to shunt current during an ESD event. However, it is to be appreciated that the present disclosure is not limited to this example. In this regard, FIG. 3B shows an example in which a portion 355 of the second inductor 140 of the transformer 120 is used to shunt current around the switch 220 during an ESD event instead of the shunt inductor 210. In this example, the switch 220 (e.g., drain of the transistor 225) is coupled to a tap 350 on the second inductor 140, in which the portion 355 of the second inductor 140 is between the tap 350 and ground. The portion 355 of the second inductor 140 is coupled in parallel with the transistor 225. During an ESD event, the second inductor 140 of the transformer 120 provides a discharge path (i.e., shunt path) between the pad 180 and ground to pass ESD current. Since the portion 355 of the second inductor 140 is coupled in parallel with the switch 220, the portion 355 of the second inductor 140 shunts ESD current around the switch 220.

Figure 4:
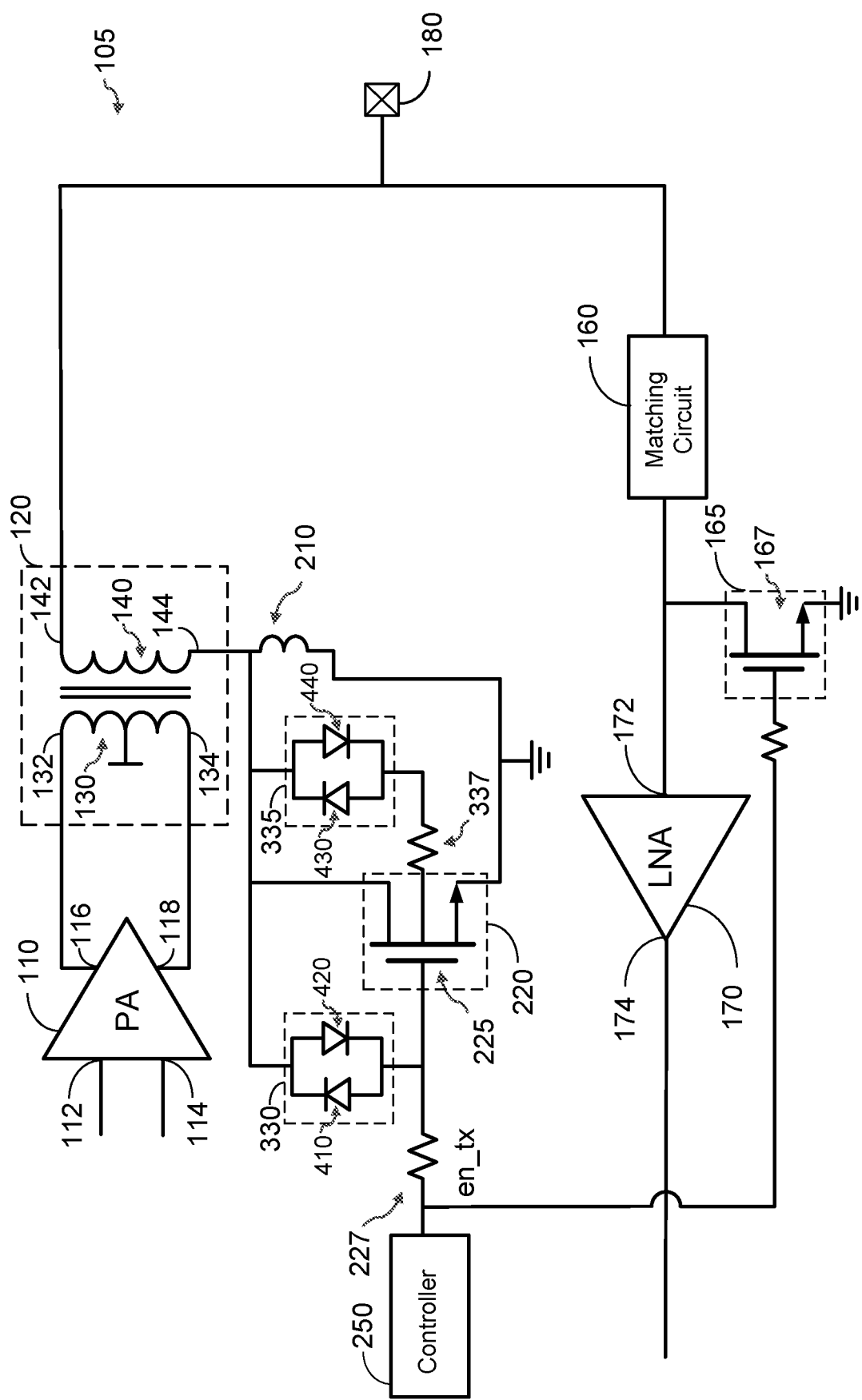
FIG. 4 shows an example where the one or more clamp circuits are implemented with diodes according to certain aspects of the present disclosure.

FIG. 4 shows an exemplary implementation of the first clamp circuit 330 according to certain aspects. In this example, the first clamp circuit 330 includes a first diode 410 and a second diode 420 coupled between the gate and the drain of the transistor 225. The first diode 410 is oriented in the forward direction from the gate to the drain of the transistor 225 with the anode of the first diode 410 coupled to the gate of the transistor 225 and the cathode of the first diode 410 coupled to the drain of the transistor 225. The second diode 420 is oriented in the forward direction from the drain to the gate of the transistor 225 with the anode of the second diode 420 coupled to the drain of the transistor 225 and the cathode of the second diode 420 coupled to the gate of the transistor 225. As discussed further below, the first diode 410 and the second diode 420 are configured to protect the transistor 225 during both positive and negative CDM tests or other ESD events.

During a CDM test, the chip is positively or negatively charged. The time lag between the gate and the drain of the transistor 225 causes a voltage to develop between the gate and the drain of the transistor 225. The voltage at the gate of the transistor 225 may be higher or lower than the voltage at the drain of the transistor 225 depending on whether the chip is being negatively or positively charged. In addition, discharge current during the discharging phase of the CDM test induces a voltage between the gate and the drain of the transistor 225.

For the case where the voltage at the gate is higher than the voltage at the drain, the first diode 410 turns on when the voltage between the gate and the drain reaches the turn-on voltage of the first diode 410. The turning on of the first diode 410 provides a current path between the gate and the drain of the transistor 225. The current path help s prevent the voltage between the gate and the drain of the transistor 225 from increasing further and reaching the breakdown voltage of the transistor 225, thereby preventing damage to the transistor 225. The current flow through the first diode 410 needed to clamp the voltage between the gate and the drain of the transistor 225 may be much lower than the current flow through the shunt inductor 210 or the portion 355 of the second inductor 140 (shown in FIG. 3B). For example, during ESD discharge, the current flow through the first diode 410 may be a few tens of milliamperes while the current flow through the shunt inductor 210 or the portion 355 of the second inductor may be on the order of amperes. The low current flow through the first diode 410 allows the first diode 410 to be implemented with a small diode to reduce area.

In certain aspects, the turn-on voltage of the first diode 410 may be higher than the voltage output by the controller 250 to turn on the transistor 225 in the transmit mode. This may be done to prevent the voltage from the controller 250 from unintentionally turning on the first diode 410 in the transmit mode.

For the case where the voltage at the drain is higher than the voltage at the gate, the second diode 420 turns on when the voltage between the gate and the drain reaches the turn-on voltage of the second diode 420. The turning on of the second diode 420 provides a current path between the drain and the gate of the transistor 225. The current path helps prevent the voltage between the drain and the gate of the transistor 225 from increasing further and reaching the breakdown voltage of the transistor 225, thereby preventing damage to the transistor 225. The current flow through the second diode 420 needed to clamp the voltage between the drain and the gate of the transistor 225 may be much lower than the current flow through the shunt inductor 210 or the portion 355 of the second inductor (shown in FIG. 3B). This allows the second diode 420 to be implemented with a small diode to reduce area.

Thus, the first diode 410 and the second diode 420 provide ESD protection between the gate and the drain of the transistor 225 in both directions. More particularly, the first diode 410 provides ESD protection for the case where the gate voltage is higher than the drain voltage, and the second diode 420 provides ESD protection for the case where the drain voltage is higher than the gate voltage.

In this example, the second clamp circuit 335 includes a third diode 430 and a fourth diode 440 coupled between the body (also referred to as back-gate) and the drain of the transistor 225. The third diode 430 is oriented in the forward direction from the body to the drain of the transistor 225 with the anode of the third diode 430 coupled to the body of the transistor 225 and the cathode of the third diode 430 coupled to the drain of the transistor 225. The fourth diode 440 is oriented in the forward direction from the drain to the body of the transistor 225 with the anode of the fourth diode 440 coupled to the drain of the transistor 225 and the cathode of the fourth diode 440 coupled to the body of the transistor 225.

During a CDM test, the chip is positively or negatively charged. The time lag between the body and the drain of the transistor 225 causes a voltage to develop between the body and the drain of the transistor 225. The voltage at the body of the transistor 225 may be higher or lower than the voltage at the drain of the transistor 225 depending on whether the chip is being negatively or positively changed. In addition, discharge current during the discharging phase of the CDM test induces a voltage between the body and the drain of the transistor 225.

For the case where the voltage at the body is higher than the voltage at the drain, the third diode 430 turns on when the voltage between the body and the drain reaches the turn-on voltage of the third diode 430. The turning on of the third diode 430 provides a current path between the body and the drain of the transistor 225. The current path helps prevent the voltage between the body and the drain of the transistor 225 from increasing further and reaching the breakdown voltage of the transistor 225, thereby preventing damage to the transistor 225. The current flow through the third diode 430 needed to clamp the voltage between the body and the drain of the transistor 225 may be much lower than the current flow through the shunt inductor 210 or the portion 355 of the second inductor 140 (shown in FIG. 3B). This allows the third diode 430 to be implemented with a small diode to reduce area.

For the case where the voltage at the drain is higher than the voltage at the body, the fourth diode 440 turns on when the voltage between the drain and the body reaches the turn-on voltage of the fourth diode 440. The turning on of the fourth diode 440 provides a current path between the drain and the body of the transistor 225. The current path helps prevent the voltage between the drain and the body of the transistor 225 from increasing further and reaching the breakdown voltage of the transistor 225, thereby preventing damage to the transistor 225. The current flow through the fourth diode 440 needed to clamp the voltage between the drain and the body of the transistor 225 may be much lower than the current flow through the shunt inductor 210 or the portion 355 of the second inductor 140 (shown in FIG. 3B). This allows the fourth diode 440 to be implemented with a small diode to reduce area.

Thus, the third diode 430 and the fourth diode 440 provide ESD protection between the body and the drain of the transistor 225 in both directions. More particularly, the third diode 430 provides ESD protection for the case where the body voltage is higher than the drain voltage, and the fourth diode 440 provides ESD protection for the case where the drain voltage is higher than the body voltage.

As discussed above, the controller 250 may turn on the transistor 225 in the transmit mode by applying a voltage to the gate of the transistor 225. If the voltage used to turn on the transistor 225 exceeds the turn-on voltage of the first diode 410, then this voltage may unintentionally turn on the first diode 410 during normal operation. To prevent this, the first clamp circuit 330 may include a fifth diode 510 coupled in series with the first diode 410 between the gate and the drain of the transistor 225, as shown in the example in FIG. 5. In this example, the fifth diode 510 is orientated in the forward direction from the gate to the drain of the transistor 225. In this example, the first diode 410 and the fifth diode 510 turn on when the gate voltage is higher than the drain voltage and the voltage between the gate and the drain of the transistor 225 reaches the sum of the turn-on voltages of the first diode 410 an the fifth diode 510. This prevents the voltage used to turn on the transistor 225 in the transmit mode from unintentionally turning on the diodes 410 and 510 assuming the sum of the turn-on voltages of the diodes 410 and 510 exceeds the voltage used to turn on the transistor 225. The diodes 410 and 510 provide ESD protection between the gate and the drain of the transistor 225 assuming the sum of the turn-on voltages of the diodes 410 and 510 is below the breakdown voltage of the transistor 225. In one example, the turn-on voltage of each of the diodes 410 and 510 may be approximately 0.7 V, in which case the sum of their turn-on voltages is approximately 1.4 V. Since the diodes 410 and 510 are coupled in series in this example, the diodes 410 and 510 may be referred to as a diode stack.

Figure 5:
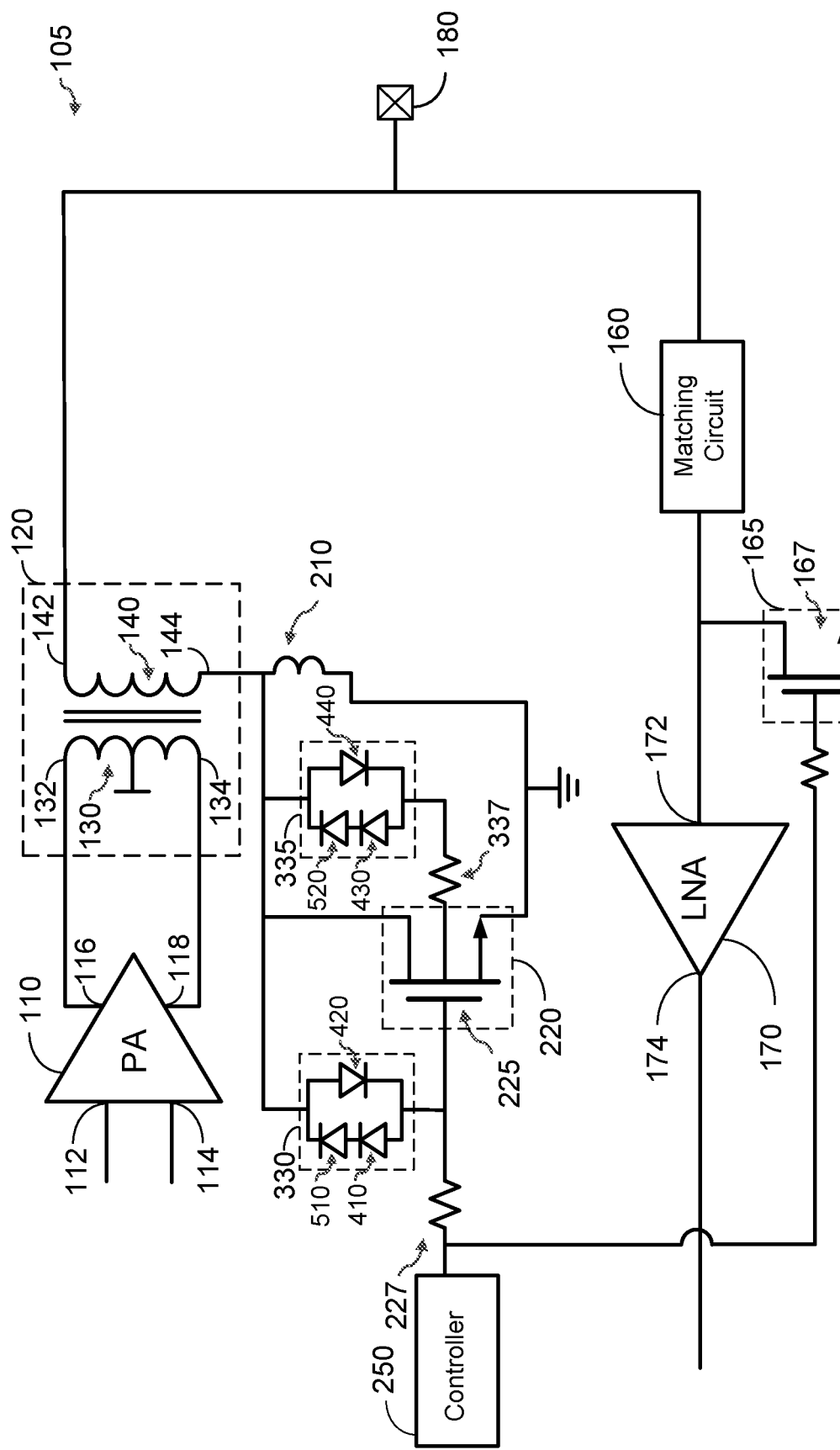
FIG. 5 shows another example where the one or more clamp circuits are implemented with diodes according to certain aspects of the present disclosure.

In the example in FIG. 5, the second clamp circuit 335 includes a sixth diode 520 coupled in series with the third diode 430 between the body and the drain of the transistor 225. In this example, the sixth diode 520 is orientated in the forward direction from the body to the drain of the transistor 225. In this example, the third diode 430 and the sixth diode 520 turn on when the body voltage is higher than the drain voltage and the voltage between the body and the drain of the transistor 225 reaches the sum of the turn-on voltages of the third diode 430 an the sixth diode 520. Assuming the sum of the turn-on voltages of the diodes 430 and 520 is below the breakdown voltage of the transistor 225, the diodes 430 and 520 provide ESD protection between the body and the drain of the transistor 225.

Figure 6:
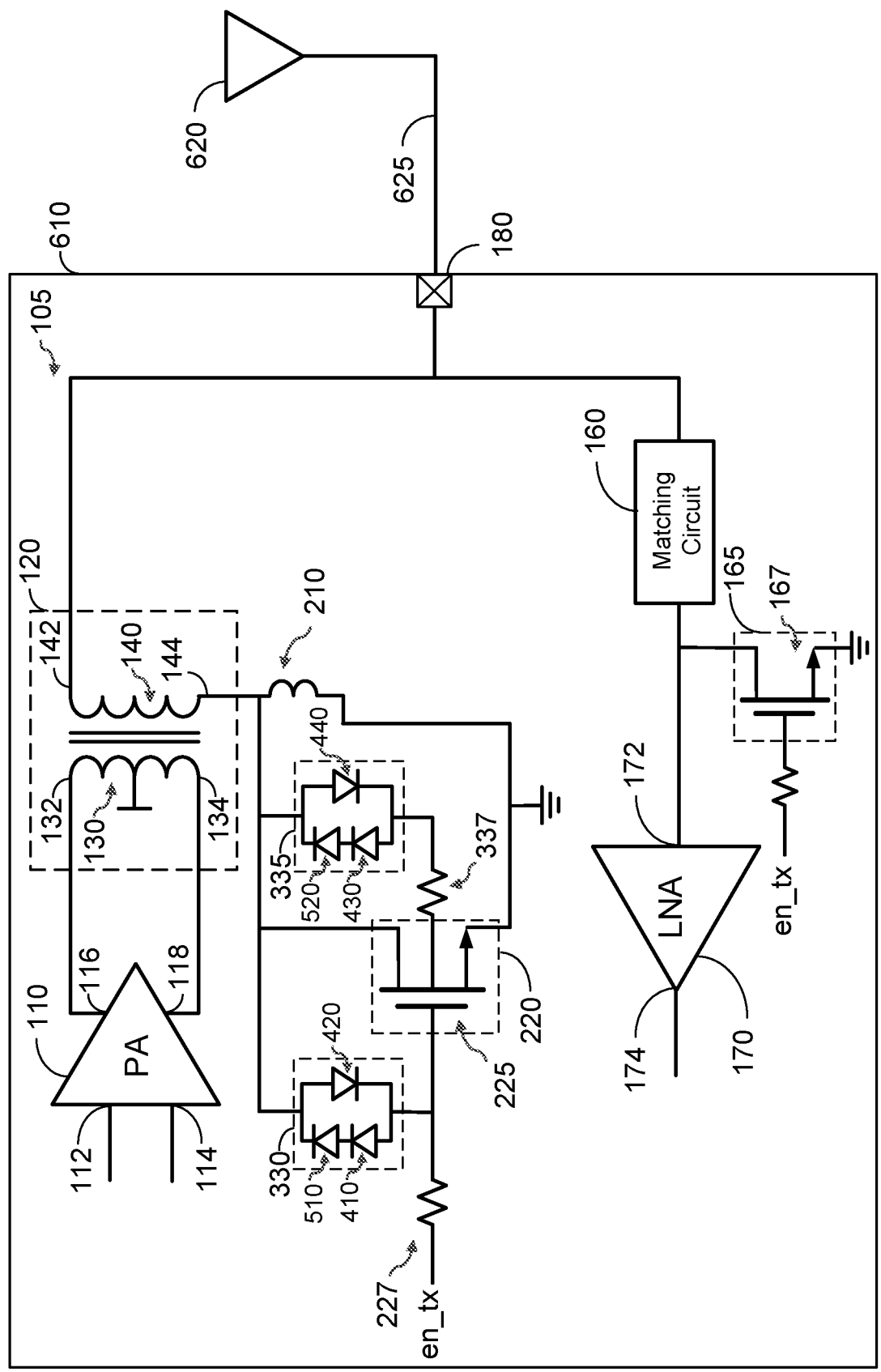
FIG. 6 shows an example where the transceiver is integrated on a chip coupled to an antenna according to certain aspects of the present disclosure.

FIG. 6 shows an example in which the transceiver 105 is integrated on a chip 610. In this example, the pad 180 on the chip 610 is coupled to an antenna 620 via a transmission line 625. The transmission line 625 may include metal routing, a cable, etc. For example, the antenna 620 and the chip 610 may be mounted on a substrate (e.g., printed circuit board) in which the transmission line 625 includes metal routing (e.g., one or more metal traces) on the substrate. It is to be appreciated that one or more intermediate components (not shown) may be coupled between the chip 610 and the antenna 620. Note that the controller 250 is not shown in FIG. 6 for ease of illustration.

Figure 7A:
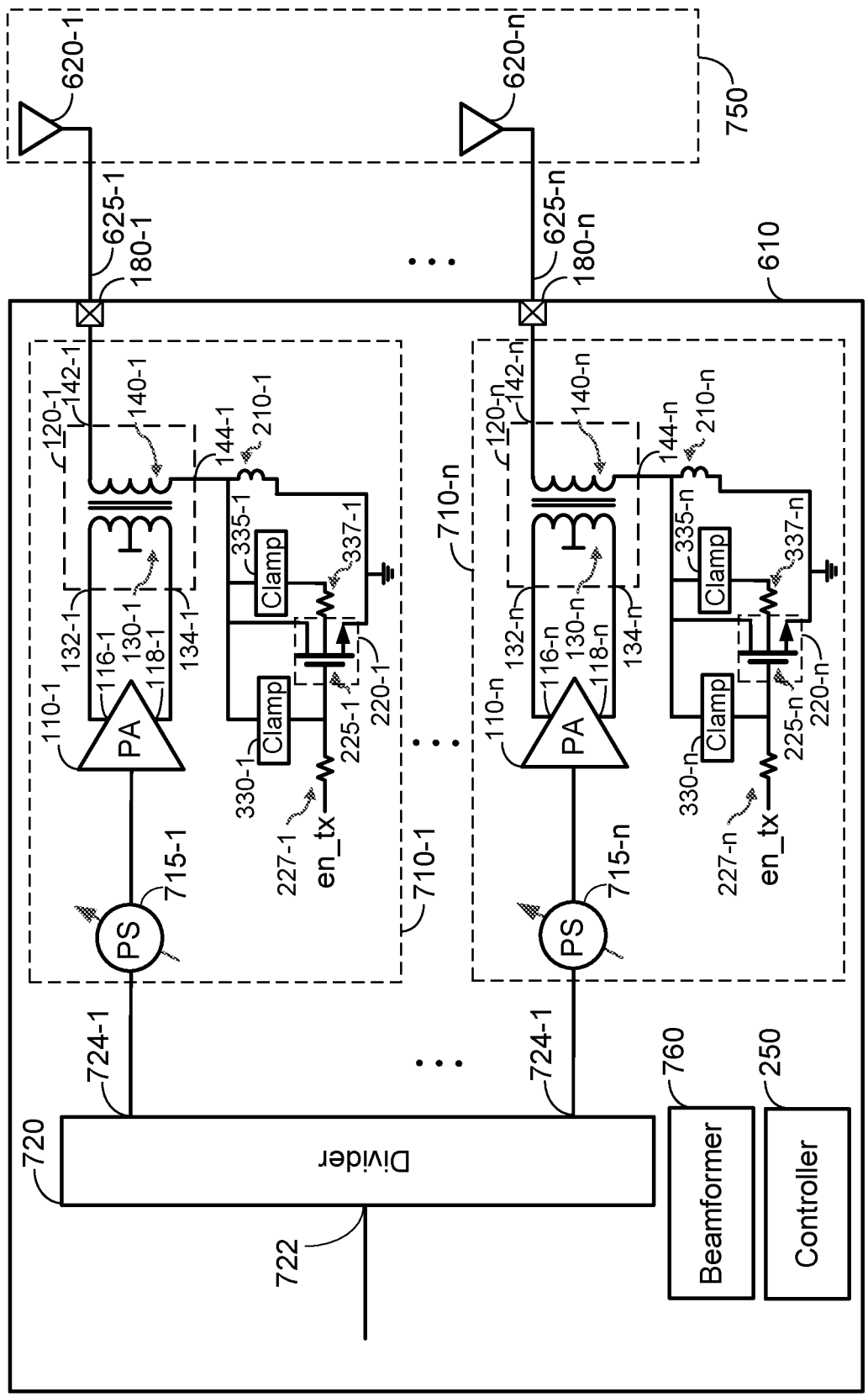
FIGS. 7A and 7B show an example of a phased antenna array with which aspects of the present disclosure may be used according to certain aspects of the present disclosure.

Although one antenna 620 is shown in FIG. 6, it is to be appreciated that a wireless device may include multiple antennas. For example, FIG. 7A shows an example in which the wireless device includes a phased antenna array 750 including multiple antennas 620-1 to 620-n for transmitting RF signals and/or receiving RF signals in a desired direction. The phased antenna array 750 may be used, for example, for mmWave band communication. An advantage of operating the wireless device in the mmWave band is that the mmWave band allows the use of small antennas (e.g., in the millimeter range). The small sizes of the antennas 620-1 to 620-n in the mmWave band significantly reduces the area of the phased antenna array 750. This allows the phased antenna array 750 to be incorporated in a handset, a small base station (e.g., customer premises equipment (CPE)), or another wireless device.

In this example, the wireless device includes a divider 720, multiple transmit chains 710-1 to 710-n, a beamformer 760, and multiple pads 180-1 to 180-n integrated on the chip 610. Each of the pads 180-1 to 180-n is coupled to a respective one of the antennas 620-1 to 620-n of the antenna array 750 via a respective transmission line 625-1 to 625-n. The divider 720 has an input 722 and multiple outputs 724-1 to 724-n. The divider 720 is configured to receive an RF signal at the input 722 (e.g., from a frequency-up converter or another device), split the RF signal into multiple RF signals, and output each of the multiple RF signals at a respective one of the multiple outputs 724-1 to 724-n.

Each of the transmit chains 710-1 to 710-n is coupled between a respective one of the outputs 724-1 to 724-n of the divider 720 and a respective one of the pads 180-1 to 180-n. In this example, each of the transmit chains 710-1 to 710-n is coupled to a respective one of the antennas 620-1 to 620-n via the respective pad 180-1 to 180-n. Each of the transmit chains 710-1 to 710-n includes a respective phase shifter 715-1 to 715-n, a respective PA 110-1 to 110-n, and a respective transformer 120-1 to 120-n. In each of the transmit chains 710-1 to 710-n, the respective phase shifter 715-1 to 715-n is coupled between the respective divider output 724-1 to 724-n and the input of the respective PA 110-1 to 110-n. Also, in each transmit chain 710-1 to 710-n, the respective transformer 120-1 to 120-n is coupled between the differential output of the respective PA 110-1 to 110-n and the respective pad 180-1 to 180-n. Each transformer 120-1 to 120-n may be implemented with the exemplary transformer 120 illustrated in FIGS. 2 to 6 (i.e., each transformer 120-1 to 120-n is a separate instance of the transformer 120). As shown in FIG. 7, the first terminal 132-1 and 132-n of each transformer 120-1 to 120-n is coupled to the first output 116-1 to 116-n of the respective PA 110-1 to 110-n and the second terminal 134-1 to 134-n of each transformer 120-1 to 120-n is coupled to the second output 118-1 to 118-n of the respective PA 110-1 to 110-n. The third terminal 142-1 to 142-n of each transformer 120-1 to 120-n is coupled to the respective pad 180-1 to 180-n.

Each transmit chain 710-1 to 710-n also includes a respective switch 220-1 to 220-n, a respective shunt inductor 210-1 to 210-n, a respective first clamp circuit 330-1 to 330-n, and a respective second clamp circuit 335-1 to 335-n. In this example, each switch 220-1 to 220-n is implemented with a respective transistor 225-1 to 225-n (e.g., respective NFET) coupled between the fourth terminal 144-1 to 144-n of the respective transformer 120-1 to 120-n and ground. In each transmit chain 710-1 to 710-n, the respective shunt inductor 210-1 to 210-n is coupled in parallel with the respective transistor 225-1 to 225-n, the respective first clamp circuit 330-1 to 330-n is coupled between the gate and the drain of the respective transistor 225-1 to 225-n, and the respective second clamp circuit 335-1 to 335-n is coupled between the body and the drain of the respective transistor 225-1 to 225-n. Each of the first clamp circuits 330-1 to 330-n may be implemented with any of the exemplary implementations of the first clamp circuit 330 illustrated in FIGS. 3A to 6, and each of the second clamp circuits 335-1 to 335-n may be implemented with any of the exemplary implementations of the second clamp circuit 335 illustrated in FIGS. 3A to 6.

Each of the phase shifters 715-1 to 715-n is configured to shift the phase of the signal in the respective transmit chain 710-1 to 710-n under the control of the beamformer 760. For ease of illustration, the individual connections between the beamformer 760 and the phase shifters 715-1 to 715-n are not explicitly shown in FIG. 7A. In operation, the beamformer 760 uses the phase shifters 715-1 to 715-n to shift the phases of the signals in the transmit chains 710-1 to 710-n by respective phase shifts to achieve a desired transmit beam direction for the antenna array 750 in the transmit mode.

Figure 7B:
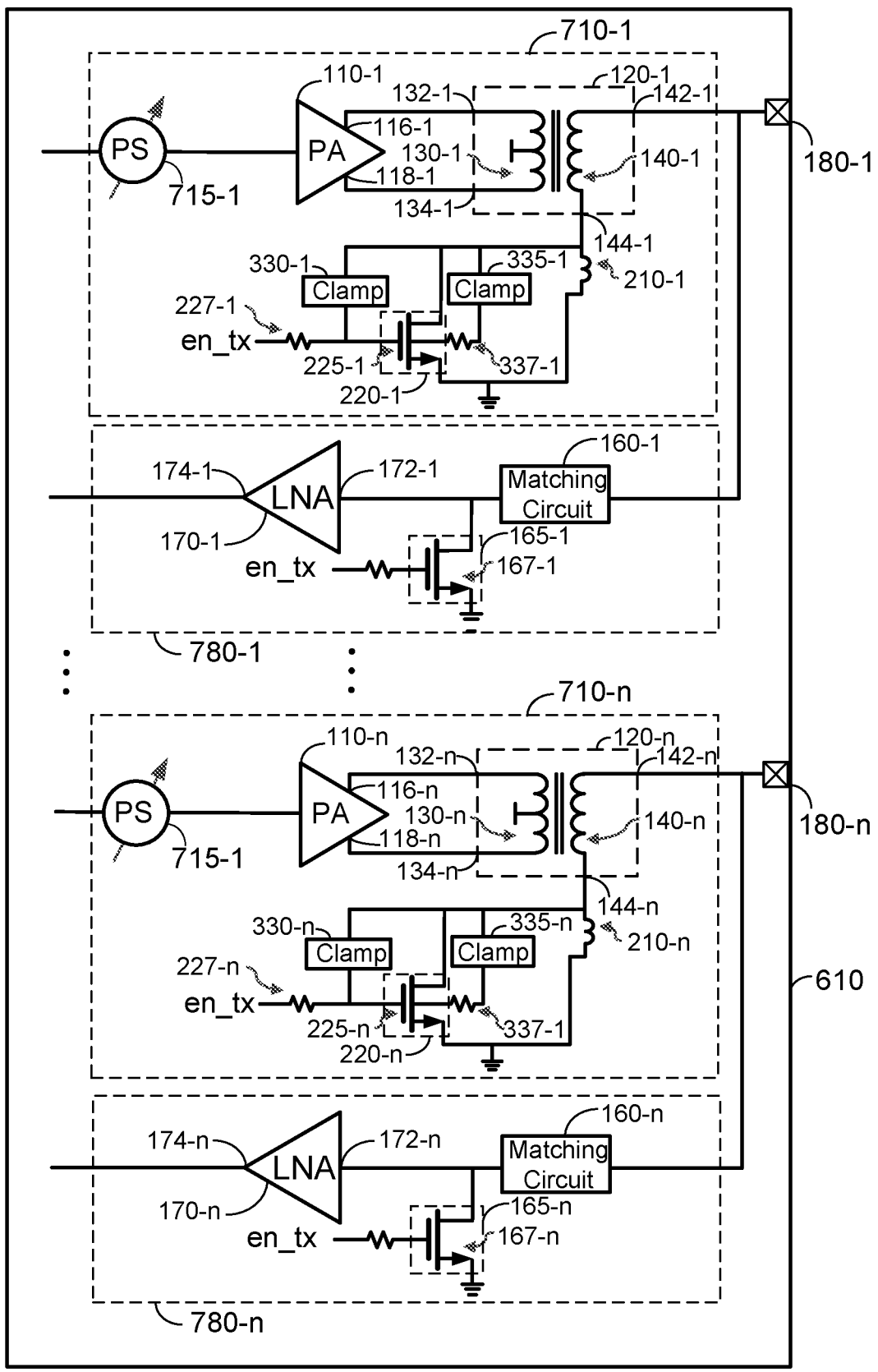

The chip 610 may also include multiple receive chains 780-1 to 780-n, an example of which is shown in FIG. 7B. Note that the divider 720 and the antennas 620-1 to 620-n are not shown in FIG. 7B for ease of illustration. In this example, each of the receive chains 780-1 to 780-n includes a respective LNA 170-1 to 170-n, a respective impedance matching circuit 160-1 to 160-n, and a respective pull-down switch 165-1 to 165-n. In each receive chain 780-1 to 780-n, the input 172-1 to 172-n of the respective LNA 170-1 to 170-n is coupled to a respective one of the pads 180-1 to 180-n via the respective impedance matching circuit 160-1 to 160-n. Each LNA 170-1 to 170-n may be implemented with the LNA 170 shown in FIGS. 2 to 6, and each impedance matching circuit 160-1 to 160-n may be implemented with the exemplary impedance matching circuit 160 shown in FIGS. 2 to 6. Also, in each receive chain 780-1 to 780-n, the respective pull-down switch 165-1 to 165-n is coupled between the input 172-1 to 172-n of the respective LNA 170-1 to 170-n and ground.

In this example, the controller 250 (not shown in FIG. 7B) may turn on the switches 220-1 to 220-n in the transmit mode and turn off the switches 220-1 to 220-n in the receive mode. The controller 250 may also turn on the pull-down switches 165-1 to 165-n in the transmit mode and turn off the pull-down switches 165-1 to 165-n in the receive mode. Note that the individual connections between the controller 250 and the switches 220-1 to 220-n and the individual connections between the controller 250 and the pull-down switches 165-1 to 165-n are not shown in FIGS. 7A and 7B for ease of illustration.

Although not shown in FIG. 7B, it is to be appreciated that phase shifters may be coupled to the outputs 174-1 to 174-n of the LNAs 170-1 to 170-n to provide beamforming in the receive mode. In certain aspects, the phase shifters 715-1 to 715-n may be used in both the transmit mode and the receive mode. In these aspects, switches (not shown) may be used to couple the phase shifters 715-1 to 715-n to the inputs of the respective power amplifiers 110-1 to 110-n in the transmit mode and couple the phase shifters 715-1 to 715-n to the outputs of the respective LNAs 170-1 to 170-n in the receive mode.

Figure 8:
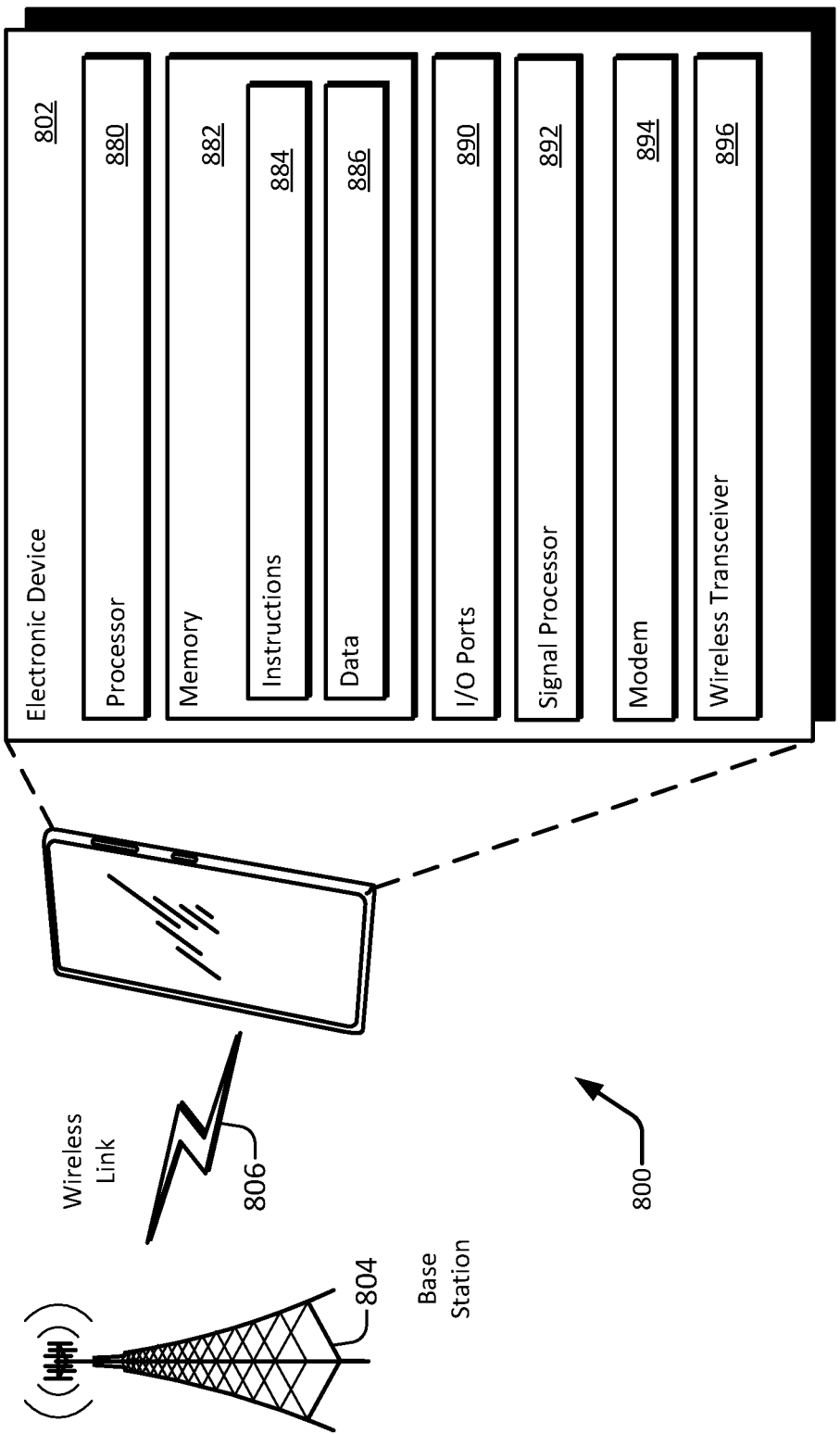
FIG. 8 is a diagram of an environment including an electronic device that includes a transceiver according to certain aspects of the present disclosure.

FIG. 8 is a diagram of an environment 800 that includes an electronic device 802 that includes a wireless transceiver 896. The transceiver 896 may include the transceiver 105, the transmit chains 710-1 to 710-n, and/or the receive chains 780-1 to 780-n according to various aspects of the present disclosure. In the environment 800, the electronic device 802 communicates with a base station 804 via a wireless link 806. As shown, the electronic device 802 is depicted as a smart phone. However, the electronic device 802 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, and so forth.

The base station 804 communicates with the electronic device 802 via the wireless link 806, which may be implemented as any suitable type of wireless link. Although depicted as a base station tower of a cellular radio network, the base station 804 may represent or be implemented as another device, such as a satellite, terrestrial broadcast tower, access point, peer to peer device, mesh network node, fiber optic line, another electronic device generally as described above, and so forth. Hence, the electronic device 802 may communicate with the base station 804 or another device via a wired connection, a wireless connection, or a combination thereof. The wireless link 806 can include a downlink of data or control information communicated from the base station 804 to the electronic device 802 and an uplink of other data or control information communicated from the electronic device 802 to the base station 804. The wireless link 806 may be implemented using any suitable communication protocol or standard, such as 3rd Generation Partnership Project Long-Term Evolution (3GPP LTE, 3GPP NR 5G), IEEE 802.11, IEEE 802.16, Bluetooth™, and so forth.

The electronic device 802 includes a processor 880 and a memory 882. The memory 882 may be or form a portion of a computer readable storage medium. The processor 880 may include any type of processor, such as an application processor or a multi-core processor, that is configured to execute processor-executable instructions (e.g., code) stored by the memory 882. The memory 882 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the memory 882 is implemented to store instructions 884, data 886, and other information of the electronic device 802, and thus when configured as or part of a computer readable storage medium, the memory 882 does not include transitory propagating signals or carrier waves.

The electronic device 802 may also include input/output ports 890. The I/O ports 890 enable data exchanges or interaction with other devices, networks, or users or between components of the device.

The electronic device 802 may further include a signal processor (SP) 892 (e.g., such as a digital signal processor (DSP)). The signal processor 892 may function similar to the processor and may be capable executing instructions and/or processing information in conjunction with the memory 882.

For communication purposes, the electronic device 802 also includes a modem 894, the wireless transceiver 896, and an antenna (e.g., antenna 620). The wireless transceiver 896 provides connectivity to respective networks and other electronic devices connected therewith using RF wireless signals. The wireless transceiver 896 may facilitate communication over any suitable type of wireless network, such as a wireless local area network (LAN) (WLAN), a peer to peer (P2P) network, a mesh network, a cellular network, a wireless wide area network (WWAN), a navigational network (e.g., the Global Positioning System (GPS) of North America or another Global Navigation Satellite System (GNSS)), and/or a wireless personal area network (WPAN).

Figure 9:
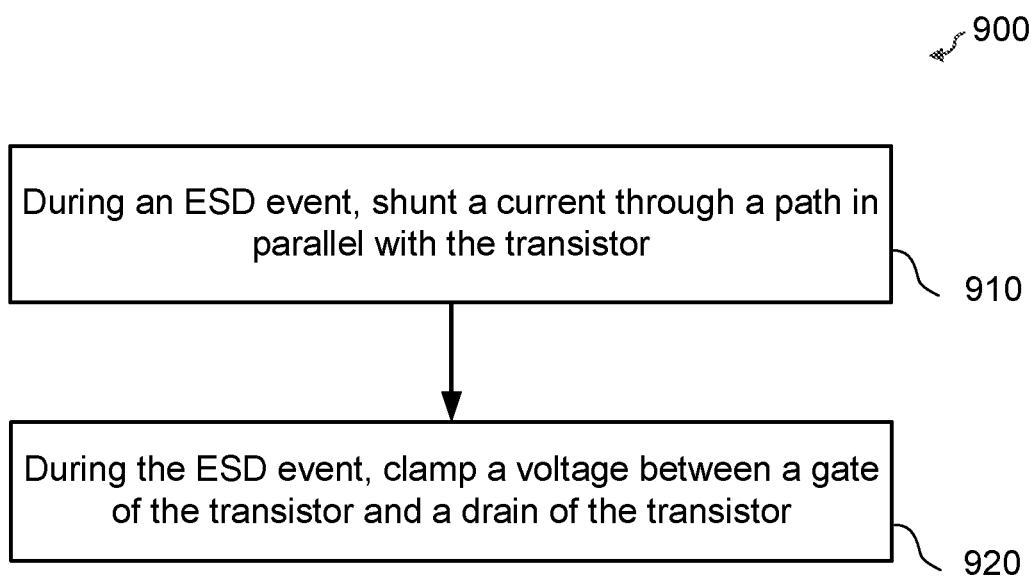
FIG. 9 is a flowchart illustrating an example of a method for electrostatic discharge (ESD) protection on a chip according to certain aspects of the present disclosure.

FIG. 9 illustrates an example of a method 900 for electrostatic discharge (ESD) protection on a chip according to certain aspects. The chip (e.g., chip 610) includes a power amplifier (e.g., PA 110), a transformer (e.g., transformer 120) coupled between the power amplifier and a pad (e.g., 180), and a transistor (e.g., transistor 225) coupled between the transformer and a ground.

At block 910, during an ESD event, current is shunted through a path in parallel with the transistor. For example, the current may be shunted through a shunt inductor (e.g., shunt inductor 210) coupled in parallel with the transistor. In certain aspects, the ESD event is a positive CDM ESD event or a negative CDM ESD event.

At block 920, during the ESD event, a voltage is clamped between a gate of the transistor and a drain of the transistor. For example, the voltage may be clamped by a clamp circuit (e.g., first clamp circuit 330) coupled between the gate of the transistor and the drain of the transistor. In certain aspects, the voltage is below a breakdown voltage of the transistor to prevent damage to the transistor during the ESD event. For example, the voltage may be clamped to a voltage below 1.5 volts.

In certain aspects, the method 900 may also include, during the ESD event, clamping a voltage between a body of the transistor and the drain of the transistor. For example, the voltage between the body and the drain may be clamped by the second clamp circuit 335.

Implementation examples are described in the following numbered clauses:

1. A chip, comprising:
   a pad;
   a power amplifier having a first output and a second output;
   a transformer, wherein the transformer comprises:
      a first inductor coupled between a first terminal and a second terminal of the transformer, wherein the first terminal is coupled to the first output of the power amplifier, and the second terminal is coupled to the second output of the power amplifier; and
      a second inductor coupled between a third terminal and a fourth terminal of the transformer, wherein the third terminal is coupled to the pad;
   a first switch coupled to the fourth terminal;
   a shunt inductor coupled in parallel with the first switch; and
   a low-noise amplifier coupled to the third terminal.

2. The chip of clause 1, wherein the first switch comprises a transistor.

3. The chip of clause 2, wherein a drain of the transistor is coupled to the fourth terminal of the transformer, and a source of the transistor is coupled to a ground.

4. The chip of clause 3, further comprising a controller coupled to a gate of the transistor, wherein the controller is configured to turn on the transistor in a transmit mode and turn off the transistor in a receive mode.

5. The chip of clause 4, further comprising a second switch coupled between an input of the low-noise amplifier and the ground, wherein the controller is configured to turn off the second switch in the transmit mode and turn on the second switch in the receive mode.

6. The chip of any one of any one of clauses 1 to 3, wherein the first switch is coupled between the fourth terminal of the transformer and a ground.

7. The chip of clause 6, further comprising a controller, wherein the controller is configured to turn on the first switch in a transmit mode and turn off the first switch in a receive mode.

8. The chip of clause 7, further comprising a second switch coupled between an input of the low-noise amplifier and the ground, wherein the controller is configured to turn off the second switch in the transmit mode and turn on the second switch in the receive mode.

9. The chip of any one of clauses 1 to 8, wherein the shunt inductor is coupled between the fourth terminal of the transformer and a ground.

10. The chip of any one of clauses 1 to 9, further comprising an impedance matching circuit coupled between the pad and an input of the low-noise amplifier.

11. An apparatus, comprising:
    a chip, comprising:
    a pad;
    a power amplifier;
    a transformer coupled between an output of the power amplifier and the pad;
    a first switch coupled between the transformer and a ground; and
    a low-noise amplifier coupled to the pad.

12. The apparatus of clause 11, further comprising a shunt inductor coupled in parallel with the first switch.

13. The apparatus of clause 11 or 12, wherein the first switch comprises a transistor.

14. The apparatus of clause 13, wherein a drain of the transistor is coupled to the transformer, and a source of the transistor is coupled to the ground.

15. The apparatus of clause 14, further comprising a controller coupled to a gate of the transistor, wherein the controller is configured to turn on the transistor in a transmit mode and turn off the transistor in a receive mode.

16. The apparatus of clause 15, further comprising a second switch coupled between an input of the low-noise amplifier and the ground, wherein the controller is configured to turn off the second switch in the transmit mode and turn on the second switch in the receive mode.

17. The apparatus of any one of clauses 13 to 16, further comprising a shunt inductor coupled in parallel with the transistor.

18. The apparatus of any one of clauses 11 to 17, wherein:
    the power amplifier has a first output and a second output;
    the transformer includes a first inductor coupled between the first output and the second output; and
    the transformer includes a second inductor coupled between the pad and the first switch.

19. The apparatus of clause 18, further comprising a shunt inductor coupled in parallel with the first switch.

20. The apparatus of any one of clauses 11 to 19, further comprising an impedance matching circuit coupled between the pad and an input of the low-noise amplifier.

21. The apparatus of any one of clauses 11 to 20, further comprising an antenna coupled to the pad.

It is to be appreciated that the present disclosure is not limited to the exemplary terminology used above to describe aspects of the present disclosure. For example, a pad may also be referred to as an interface pad, an input/output (I/O) pad, an integrated circuit (IC) pad, a pin, or another term. The inductors of a transformer may also be referred as windings of the transformer or sides of the transformer (e.g., primary side and secondary side).

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "approximately", as used herein with respect to a stated value or a property, is intended to indicate being within 10% of the stated value or property.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A chip, comprising:
    a pad;
    a power amplifier having a first output and a second output;
    a transformer, wherein the transformer comprises:
        a first inductor coupled between a first terminal and a second terminal of the transformer, wherein the first terminal is coupled to the first output of the power amplifier, and the second terminal is coupled to the second output of the power amplifier; and
        a second inductor coupled between a third terminal and a fourth terminal of the transformer, wherein the third terminal is coupled to the pad;
    a first switch coupled to the fourth terminal;
    a shunt inductor coupled in parallel with the first switch; and
    a low-noise amplifier coupled to the third terminal, wherein the second inductor is coupled between the first switch and an input of the low-noise amplifier.

2. The chip of claim 1, wherein the first switch comprises a transistor.

3. The chip of claim 2, wherein a drain of the transistor is coupled to the fourth terminal of the transformer, and a source of the transistor is coupled to a ground.

4. The chip of claim 3, further comprising a controller coupled to a gate of the transistor, wherein the controller is configured to turn on the transistor in a transmit mode and turn off the transistor in a receive mode.

5. The chip of claim 4, further comprising a second switch coupled between the input of the low-noise amplifier and the ground, wherein the controller is configured to turn on the second switch in the transmit mode and turn off the second switch in the receive mode.

6. The chip of claim 1, wherein the first switch is coupled between the fourth terminal of the transformer and a ground.

7. The chip of claim 6, further comprising a controller, wherein the controller is configured to turn on the first switch in a transmit mode and turn off the first switch in a receive mode.

8. A chip, comprising:
    a pad;
    a power amplifier having a first output and a second output;
    a transformer, wherein the transformer comprises:
        a first inductor coupled between a first terminal and a second terminal of the transformer, wherein the first terminal is coupled to the first output of the power amplifier, and the second terminal is coupled to the second output of the power amplifier; and
        a second inductor coupled between a third terminal and a fourth terminal of the transformer, wherein the third terminal is coupled to the pad;
    a first switch coupled between the fourth terminal and a ground;
    a shunt inductor coupled in parallel with the first switch;
    a low-noise amplifier coupled to the third terminal;
    a second switch coupled between an input of the low-noise amplifier and the ground; and
    a controller, wherein the controller is configured to turn on the first switch in a transmit mode, turn on the second switch in the transmit mode, turn off the first switch in a receive mode, and turn off the second switch in the receive mode.

9. The chip of claim 1, wherein the shunt inductor is coupled between the fourth terminal of the transformer and a ground.

10. The chip of claim 1, further comprising an impedance matching circuit coupled between the pad and an input of the low-noise amplifier.

11. An apparatus, comprising:
    a chip, comprising:
        a pad;
        a power amplifier;
        a transformer coupled between the power amplifier and the pad, wherein the transformer comprises:
            a first inductor coupled between a first output and a second output of the power amplifier; and
            a second inductor coupled to the pad;
        a first switch coupled between the transformer and a ground;
        a low-noise amplifier coupled to the pad; and
        a second switch coupled between an input of the low-noise amplifier and the ground, wherein the second inductor is coupled between the first switch and the second switch.

12. The apparatus of claim 11, further comprising a shunt inductor coupled in parallel with the first switch.

13. The apparatus of claim 11, wherein the first switch comprises a transistor.

14. The apparatus of claim 13, wherein a drain of the transistor is coupled to the transformer, and a source of the transistor is coupled to the ground.

15. The apparatus of claim 14, further comprising a controller coupled to a gate of the transistor, wherein the controller is configured to turn on the transistor in a transmit mode and turn off the transistor in a receive mode.

16. An apparatus, comprising:
    a chip, comprising:
        a pad;
        a power amplifier;
        a transformer coupled between an output of the power amplifier and the pad;
        a first switch coupled between the transformer and a ground, the first switch comprising a transistor, wherein a drain of the transistor is coupled to the transformer, and a source of the transistor is coupled to the ground;
        a low-noise amplifier coupled to the pad;
        a second switch coupled between an input of the low-noise amplifier and the ground; and
        a controller coupled to a gate of the transistor, wherein the controller is configured to turn on the transistor in a transmit mode, turn on the second switch in the transmit mode, turn off the transistor in a receive mode, and turn off the second switch in the receive mode.

17. The apparatus of claim 13, further comprising a shunt inductor coupled in parallel with the transistor.

18. The apparatus of claim 16, wherein:
    the power amplifier has a first output and a second output;
    the transformer includes a first inductor coupled between the first output and the second output; and the transformer includes a second inductor coupled between the pad and the first switch.

19. The apparatus of claim 18, further comprising a shunt inductor coupled in parallel with the first switch.

20. The apparatus of claim 11, further comprising an impedance matching circuit coupled between the pad and the input of the low-noise amplifier.

21. The apparatus of claim 11, further comprising an antenna coupled to the pad.

22. The chip of claim 3, wherein the second inductor is coupled between the drain of the transistor and the input of the low-noise amplifier.

23. The apparatus of claim 15, wherein the controller is configured to turn on the second switch in the transmit mode and turn off the second switch in the receive mode.

* * * * *